United States Patent
Chen et al.

(10) Patent No.: US 6,429,118 B1
(45) Date of Patent: Aug. 6, 2002

(54) ELIMINATION OF ELECTROCHEMICAL DEPOSITION COPPER LINE DAMAGE FOR DAMASCENE PROCESSING

(75) Inventors: Ying-Ho Chen, Taipei; Syun-Ming Jang, Hsin-Chu; Jih-Churng Twu, Chung-Ho; Tsu Shih, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 43 days.

(21) Appl. No.: 09/664,414

(22) Filed: Sep. 18, 2000

(51) Int. Cl.⁷ ............................................. H01L 21/3213
(52) U.S. Cl. ...................... 438/629; 438/633; 438/687
(58) Field of Search ................................ 438/633, 627, 438/629, 687, FOR 350

(56) References Cited

U.S. PATENT DOCUMENTS

| | | | |
|---|---|---|---|
| 5,780,358 A | 7/1998 | Zhou et al. ............... 438/645 |
| 5,877,084 A | 3/1999 | Joshi et al. .............. 438/46 |
| 6,010,962 A | 1/2000 | Liu et al. ................ 438/687 |
| 6,130,167 A | * 10/2000 | Tao et al. |
| 6,140,241 A | * 10/2000 | Shue et al. |
| 6,146,941 A | * 11/2000 | Huang et al. |
| 6,261,963 B1 | * 7/2001 | Zhao et al. |
| 6,297,158 B1 | * 10/2001 | Liu et al. |
| 6,303,486 B1 | * 10/2001 | Park |
| 6,303,498 B1 | * 10/2001 | Chen et al. |
| 6,309,969 B1 | * 10/2001 | Oskam et al. |
| 6,323,121 B1 | * 11/2001 | Liu et al. |
| 6,329,234 B1 | * 12/2001 | Ma et al. |

\* cited by examiner

Primary Examiner—Wael Fahmy
Assistant Examiner—Joannie Adelle Garcia
(74) Attorney, Agent, or Firm—George O. Saile; Stephen B. Ackerman

(57) ABSTRACT

An improved and new process, used for the elimination of copper line damage in damacene processing, is disclosed. By depositing copper by physical vapor deposition (PVD), sputtering, preferably by an ion metal plasma (IMP) scheme or chemical vapor deposition (CVD), the deposited copper fills pinholes or intra-cracks (micro-cracks), caused by poor gap filling of purely electrochemical deposition of copper plating. By this process or method, chemical attack on copper lines, by chemicals in the subsequent chemical mechanical polish (CMP) back and post-cleaning steps, is prevented.

37 Claims, 2 Drawing Sheets

ELIMINATION OF ELECTROCHEMICAL DEPOSITION COPPER LINE DAMAGE FOR DAMASCENE PROCESSING

BACKGROUND OF THE INVENTION

(1) Field of the Invention

This invention relates to a method of fabrication used for semiconductor integrated circuit devices, and more specifically to the elimination of copper line damage for damascene processing, by depositing copper by physical vapor deposition (PVD), sputtering, preferably by an ion metal plasma (IMP) scheme or chemical vapor deposition (CVD), the deposited copper fills the pinholes or intra-cracks (micro-cracks) caused by poor gap filling of purely electrochemical deposition of copper plating, and therefore, prevents attack by chemicals in the subsequent chemical mechanical polish (CMP) back and post-cleaning steps.

(2) Description of Related Art

As an introduction and background to Prior Art, the conventional dual damascene process scheme is commonly used to fabricate copper interconnects, trench, and contact vias. Dual Damascene wiring interconnects (and/or studs) are formed by depositing one or two dielectric layers on a planar surface, patterning it using photolithography and dielectric reactive ion etch (RIE), then filling the recesses with conductive copper metal. The excess metal is removed by chemical mechanical polishing (CMP), while the troughs or channels remain filled with inlaid metal. With the dual damascene process, two layers of metal are formed as one, i.e., wiring line and contact stud vias, avoiding an interface between the layers.

The copper metal deposition in some Prior Art methods is performed by purely using an electrochemical deposition (ECD) of copper process, or various electroless copper plating methods, sometimes termed copper "auto-plating". These copper plating processes has been shown to produce interconnect copper line damage, during chemical mechanical polishing (CMP) back of the excess copper metal. Surface voids and recesses have been observed, induced by poor gap filling of the electrochemical deposited (ECD) copper plating process. In addition, some pinholes and intra-crack (micro-cracks) have been found on the electrochemical deposited (ECD) copper surface. These "weak", defective structures are easily attacked by the chemicals in the copper slurry, oxide slurry and post polishing cleaning steps.

Related Prior Art background patents will now be described in this section.

U.S. Pat. No. 6,010,962 entitled "Copper Chemical Mechanical Polishing (CMP) Dishing" granted Jan. 4, 2000 to Liu et al. describes a process for copper chemical mechanical polishing (CMP), forming inlaid copper interconnects in an insulating layer without the normally expected dishing that occurs after chemical mechanical polishing of the excess copper. This is accomplished by forming a conformal blanket barrier layer over a substrate, including a composite groove/hole structure already formed in an insulating layer and then growing a copper seed layer over the barrier layer. A layer of photoresist is next deposited over the substrate filling the composite structure. The photoresist layer, seed layer and the barrier layer are then removed by chemical mechanical polishing, leaving the seed layer and the barrier layer on the inside walls of the composite structure. Then the photoresist is removed from the composite structure, and replaced with electroless plated copper, which forms a dome-like protrusion extending from the composite structure. When the substrate is subjected to chemical-mechanical polishing in order to remove the excess copper, the dome-like structure prevents the dishing of the copper metal.

U.S. Pat. No. 5,877,084 entitled "Method for Fabricating High Aspect Ratio Low Resistivity Lines/Vias by Surface Reaction" granted Mar. 2, 1999 to Joshi et al. recites a method for fabricating high aspect ratio, low resistivity lines/vias, by surface reaction by forming a cap layer over a copper interconnect. The method describes the use of low temperature germanium gas flow to affect metals and alloys deposited in high aspect ratio structures including lines and vias. By using a germanium gas flow, germanium (Ge) will be introduced in a surface reaction which prevents voids and side seams and which also provides a passivating layer of CuGe.

U.S. Pat. 5,780,358 entitled "Method for Chemical Mechanical Polish (CMP) Planarizing of Copper Containing Conductor Layers" granted Jul. 14, 1998 to Zhou et al. shows Chemical-Mechanical Polish (CMP) planarizing method and a Chemical-Mechanical Polish (CMP) slurry composition for Chemical-Mechanical Polish (CMP) planarizing of copper metal and copper metal alloy layers. The Chemical-Mechanical Polish (CMP) slurry composition is a non-aqueous coordinating solvent and halogen radical producing species.

SUMMARY OF THE INVENTION

It is a general object of the present invention to provide an improved method of forming an integrated circuit in which copper line damage is eliminated for damascene processing, by depositing copper by physical vapor deposition (PVD), sputtering, preferably by an ion metal plasma (IMP) scheme or chemical vapor deposition (CVD), the deposited copper fills the pinholes or intra-cracks (micro-cracks) caused by poor gap filling of purely electrochemical deposition of copper plating, and therefore, prevents attack by chemicals in the subsequent chemical mechanical polish (CMP) back and post-cleaning steps.

The process embodiments of this invention start with the first process step, the forming by damascene and chemical mechanical polishing (CMP) the first level inlaid metal structures. The process sequence is as follows: an insulating layer is deposited. This first insulating layer, e.g., silicon oxide, is patterned and reactive ion etched (RIE) upon a semiconductor substrate. The next processing step in building of the damascene structure, is the deposition by sputtering (PVD, physical vapor deposition) and patterning of a thin metal barrier layer (trench liner), e.g. Ta,TaN, and a thin copper seed layer. Copper metal is deposited upon the seed layer in the openings in insulator by electrochemical copper deposition (ECD). The excess copper metal is polished off and planarized with surface by chemical mechanical polishing (CMP) forming the first level of conducting metal wiring.

Continuing with the summation of the process embodiments of this invention, is the second process step, the deposition of a copper metal protecting "buffer layer". This layer is needed to prevent copper corrosion with silicon oxide layers. It is deposited over the first level inlaid metal structures and first insulator layer. This buffer layer is, e.g., silicon nitride. The third process step is the blanket deposition of an intermetal dielectric (IMD) layer upon the buffer layer. This intermetal dielectric (IMD) is, e.g., silicon oxide, silicon nitride, or FSG fluoro-silicate glass, or PSG phosphosilicate glass. The fourth step is to form a photoresist masking layer by a lithography process, defining damascene openings or trench/vias openings, over the first level of metal. Photoresist is coated and patterned upon the intermetal dielectric (IMD) layer. A reactive ion etch (RIE) is performed to etch the intermetal dielectric layer (IMD) layer, forming openings and stopping on the buffer layer. The fifth step is removal of the photoresist material and the metal protecting buffer layer in the exposed opening areas. The sixth and seventh steps are the deposition of both a metal diffusion barrier layer and a copper seed layer, over the patterned intermetal dielectric (IMD) layer and over the first level of conductor wiring, into the damascene openings.

The eighth step in this process, considered one of the key processing steps, is the electrochemical deposition (ECD) of copper metal, upon the seed layer. Another key embodiment of this invention now follows, in summary form. The ninth step of the process is considered to be the key process step, in achieving a smooth copper metal surface. This key step is the sputter deposition of a top copper layer upon the electrochemical deposited layer (ECD) copper layer, which is performed by physical vapor deposition (PVD), preferably by an ion metal plasma (IMD) scheme, or by chemical vapor depositon (CVD). Key to this invention is that this top copper layer, eliminates the defects or damage regions found in the purely electrochemical deposited copper layer, just prior to chemical mechical polishing (CMP) and post-clean process steps. The final process embodiments of this invention are, the tenth step in this process, the chemical mechanical polishing (CMP) back of the excess copper metal, composed of a composite layer of both electrochemical deposited (ECD) copper and a special sputtered copper top layer, that act to heal defects and damaged regions in the film. The copper metal is planarized with the top surface of the insulating layer or intermetal dielectric layer, with a very smooth copper surface.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of fabrication used for semiconductor integrated circuit devices, the elimination of copper line damage for damacene processing, by depositing copper by physical vapor deposition (PVD), sputtering, preferably by an ion metal plasma (IMP) scheme or chemical vapor deposition (CVD), the deposited copper fills the pinholes or intra-cracks (micro-cracks) caused by poor gap filling of purely electrochemical deposition of copper plating, and therefore, prevents attack by chemicals in the subsequent chemical mechanical polish (CMP) back and post-cleaning steps. This process or method will now be described in detail.

Figure 1:
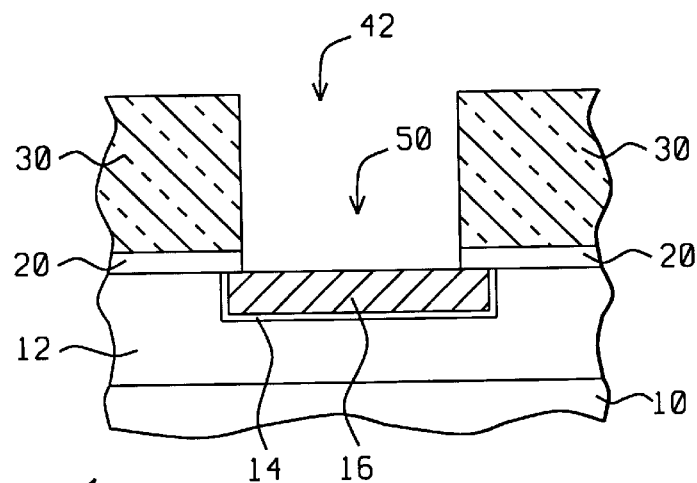
FIG. 1, which in cross-sectional representation, is sketched are first steps in this process, forming a damascene and first level inlaid metal.

Referring to FIG. 1 illustrated in cross-sectional drawing, is sketched the start of the process embodiments of this invention. The first step (for reference STEP ONE) in the process of this invention is the formation by damascene and chemical mechanical polishing (CMP) of the first level inlaid metal structures 16. The process sequence is as follows: an insulating layer 12 is deposited. This first insulating layer 12 or layer of dielectric, e.g., silicon oxide, is patterned and reactive ion etched (RIE) upon a semiconductor substrate 10. The next processing step in building of the damascene structure, is the deposition by sputtering (PVD, physical vapor deposition) and patterning of a thin metal barrier layer 14 or barrier material (trench liner), e.g. Ta,TaN, and a thin copper seed layer (too thin to sketch in FIGS.), for subsequent deposition of copper. Copper metal is deposited upon the seed layer in the openings in insulator 12. The excess copper metal is polished off and planarized with surface by chemical mechanical polishing (CMP) forming the first level conductor wiring 16 (copper metal remaining inlaid in the open regions), for the bottom metal layer 16.

Referring again to FIG. 1 illustrated in cross-sectional drawing, is sketched a continuation of process embodiments of this invention. The second step (for reference STEP TWO) in this process is the deposition of a copper metal protect "buffer layer" 20, needed to prevent copper corrosion with silicon oxide layers, over the first level inlaid metal structures 16 and first insulator layer 12. This buffer layer 20 is, e.g., silicon nitride, thickness range from approximately 200 to 1,200 Angstroms. The third step (for reference STEP THREE) in this process is the blanket deposition of an intermetal dielectric (IMD) layer 30 upon the buffer layer 20. This intermetal dielectric (IMD) is, e.g., silicon oxide, silicon nitride deposited by chemical vapor deposition (CVD), or FSG fluoro-silicate glass, or PSG phosphosilicate glass. The fourth step (for reference STEP FOUR) in this process is to form a photoresist masking layer by a lithography process, defining a trench area 42, over select portions of the first level of metal 16. Photoresist 40 is coated and patterned upon the intermetal dielectric (IMD) layer 30. A reactive ion etch (RIE) is performed to etch the intermetal dielectric layer (IMD) layer 30, forming opening 42, and stopping on the buffer layer 20. Next, the fifth step (for reference STEP FIVE) in this process is removal of the photoresist material and the metal protecting buffer layer 20 in the exposed opening 50.

Figure 2:
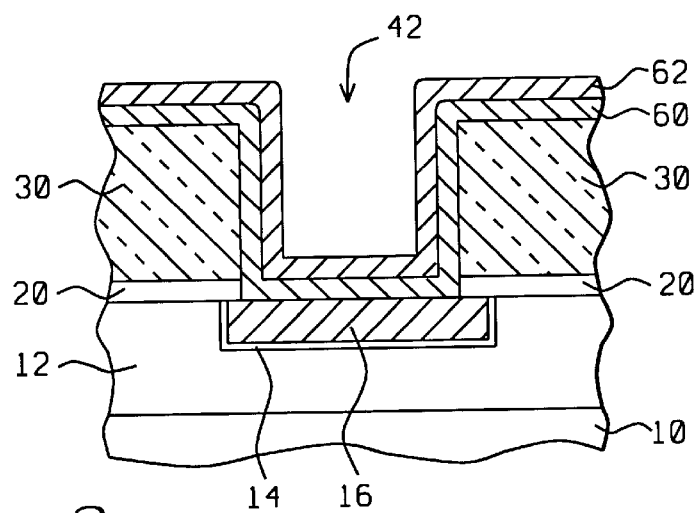
FIG. 2, which illustrated in cross-sectional drawing, is sketched the deposition of a metal diffusion barrier and copper seed layer.

Referring to FIG. 2 illustrated in cross-sectional drawing, is sketched a continuation of process embodiments of this invention. The sixth and seventh steps (for reference STEP SIX and STEP SEVEN) in this process are the deposition of both a metal diffusion barrier layer 60 and a copper seed layer 62, over the patterned intermetal dielectric (IMD) layer and over the first level of conductor wiring, into the damascene openings. The seed layer type materials consisting of thin Cu, thickness from about 1,000 to 2,000 Angstroms, deposited by ion metal plasma (IMP) or physical vapor deposition (PVD) sputtering.

Figure 3:
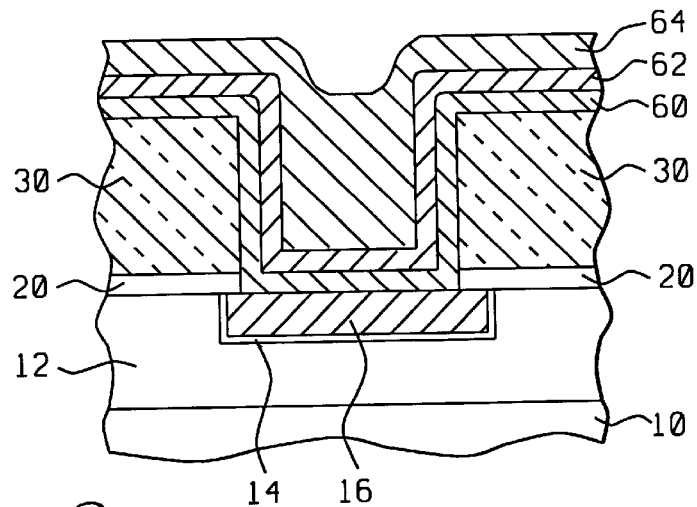
FIG. 3, which illustrated in cross-sectional drawing, is the first key process step of the invention, the blanket deposition of an electrochemical deposited (ECD) copper layer.

Referring to FIG. 3 illustrated in cross-sectional drawing, is sketched a continuation of the process embodiments of this invention. The eighth step (for reference STEP EIGHT) in this process, considered one of the key process steps, is the electrochemical deposition (ECD) of copper metal (64) upon the seed layer (62). This ECD electrically plated copper layer is deposited to a thickness approximately 6,000 Angstroms to 20,000 Angstroms, partially filling the trench region, as shown in FIG. 3.

Figure 4:
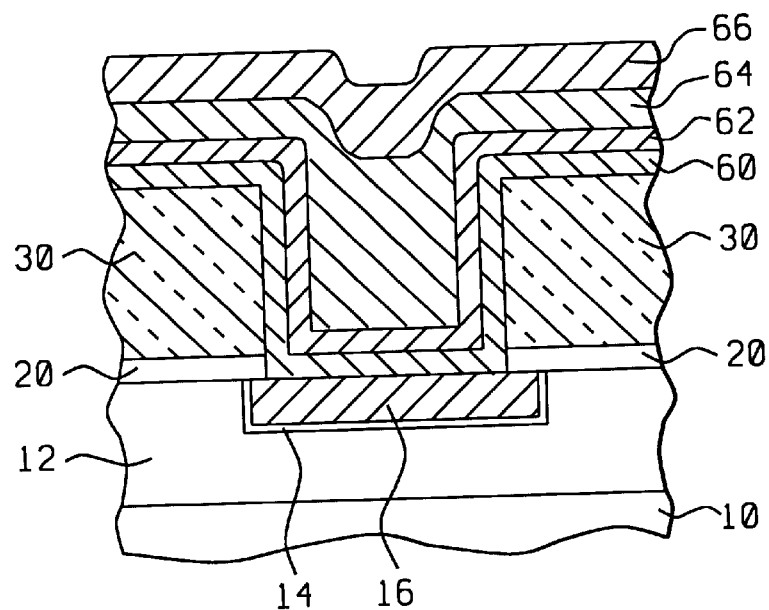
FIG. 4, which illustrated in cross-sectional drawing, is the second key process step of the invention, the blanket deposition of a physical vapor deposition (PVD), sputtered copper layer, preferably by an ion metal plasma (IMD) scheme, or chemical vapor deposition (CVD), upon the electrochemical deposited (ECD) copper layer.

Referring to FIG. 4 illustrated in cross-sectional drawing, is sketched a continuation of the process embodiments of this invention. The ninth step (for reference STEP NINE) in this process, considered another key process step, is the sputter deposition of a top copper layer (66), which is performed by physical vapor deposition (PVD), preferably by an ion metal plasma (IMD) system or scheme, or by chemical vapor deposition (CVD). This top layer of copper is deposited over the ECD copper layer (64), and the top copper layer (66) is deposited to a thickness approximately with (IMP) Cu to an approximate thickness range from 1,000 to 5,000 Angstroms, at a deposition rate of about 2,000 Angstroms per minute. Key to this invention is that the top copper layer (66), eliminates the defects or damage regions found in the purely electrochemical deposited copper layer (64), prior to chemical mechical polishing (CMP) and post-clean process steps.

Figure 5:
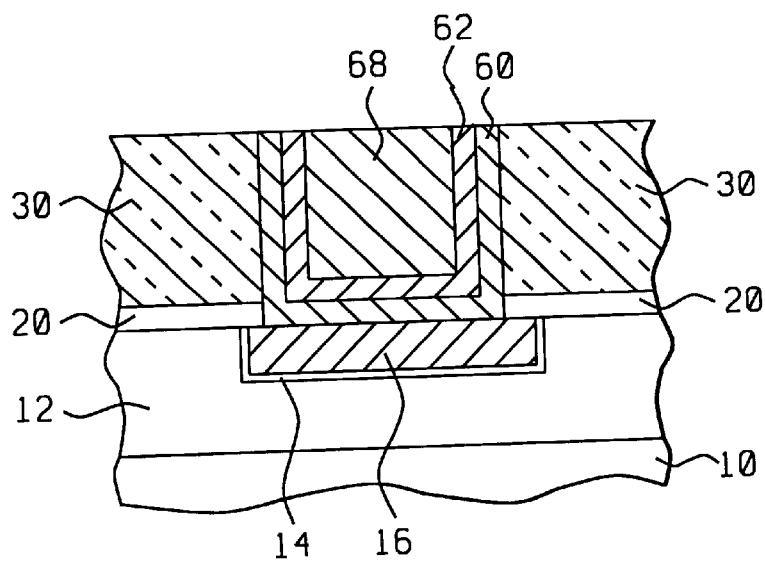
FIG. 5, which illustrated in cross-sectional drawing, the final steps of the invention, the chemical mechanical polishing (CMP) back of the excess copper metal, i.e., the composite layer of top sputtered copper layer, (or chemical vapor deposition (CVD) copper), upon the bottom electrochemical deposited (ECD) copper layer.

Referring to FIG. 5 illustrated in cross-sectional drawing, is sketched a the final process embodiments of this invention. The tenth step (for reference STEP TEN) in this process is chemical mechanical polishing (CMP) back of the excess copper metal, composed of a composite layer of both electrochemical deposited (ECD) copper and a special sputtered copper top layer, that healed defects and damaged regions in the film. The copper metal (68) is planarized with the top surface of the insulating layer or intermetal dielectric (30) layer, with a very smooth copper surface. Note, that both the top copper seed layer (62) and top barrier layer (60), are also polished back, made planar with the top surface of the insulator.

It should be noted that, wherein the levels of conducting metal copper layers can be planarized to form inlaid dual damascene conducting metal interconnects, in trench and via openings, by the following methods, selected from the group consisting of planarization by chemical mechanical polish (CMP), milling, ion milling, and/or etching, or a combination thereof.

It should also be noted that where there are damascene and dual damascene patterned openings, for subsequent inlaid metal, these openings can be formed by the following methods, selected from the group consisting of reactive ion etching (RIE), milling, ion milling, wet etching, or a combination thereof.

Table 1, as shown below, compares two sets of surface roughness data, for two different types of copper deposited interconnect film lines, showing the improved results achieved with the composite film of ECD copper and sputtered copper.

TABLE 1

| Film Type | Roughness (rms, A) | Vert. Dist. (A) |
| --- | --- | --- |
| ECD Cu 10 kA | 76.77 | 755.22 |
| ECD Cu 10 kA + PVD Cu 1kA | 70.45 | 85.73 |

Referring to Table 1, the data clearly shows that voids or damages regions and may be filled using the above described process of the invention. Table 1 a comparison of two different types of copper deposited films. The first film type listed is termed "ECD Cu 10 kA", and refers to a purely electrochemical deposition (ECD) of copper plating, 10,000 Angstroms thick. The second film listed in Table 1 is termed "ECD Cu 10 kA+PVD Cu 1 kA". This second film refers to a composite film of electrochemical deposited (ECD) copper 10,000 Angstroms thick, upon which a layer of physical vapor deposited (PVD), sputtered copper is deposited to a thickness of 1,000 Angstroms. A vertical distance across planarized copper interconnect line is scanned, termed "vert. Dist. (A)", reported in Angstrom units, and the surface roughness of the copper surface is measured, termed "Roughness (rms, Angstroms), which indicates the roughness of the surface in Angstrom unit (root mean square value). The surface roughness is reduced for the composite film, namely the "ECD Cu 10 kA+PVD Cu 1 kA" film with only a 70.45 Angstrom (rsm value) surface roughness reading. However, for the purely electrochemical (ECD) copper film, the surface roughness reading is 76.77 Angstroms (rsm value), significantly higher in surface defects than the composite film.

An ion metal plasma (IMD) deposition technique is preferred for the top sputtered copper layer, since this technique yields a highly efficient positioning of the sputtered metal atoms from a magnetron cathode. This process is based on conventional magnetron sputtering with the addition of a high density, inductively coupled rf (RFI) plasma in the region between the sputtering cathode and the substrate. Metal atoms sputtered from the cathode by an inert gas ion bombardment travel through the rf plasma and can be ionized. The metal ions can then be accelerated to the sample by means of a low voltage dc bias, such that the metal ions arrive at the sample at normal incidence and at a specified energy. The ionization fraction is low at 5 mTorr (low pressure), but at 30 mTorr (high pressure) can reach about 85%. Also, optical emission measurements have shown that the relative ionization scales with higher discharge powers. The addition of large fluxes of metal atoms tends to cool the Ar RFI plasma, although this effect depends on the chamber pressure and probably the pressure response of the electron temperature. The technique can been scaled to 300 mm cathodes and 200 mm wafers and has been demonstrated with Cu and AlCu alloys. The deposition rates are equal to or in some cases larger than with conventional magnetron sputtering. The primary application of this technique in the present invention is for fabricating a top copper layer over an electrochemically deposited copper (ECD), for lining and filling of the semiconductor trenches and vias, in manufacturing in an Applied Materials 5500 integrated process system, for example. The processes described in this invention are compatible with MOSFET CMOS processing, for CMOS devices and circuits, in both logic and memory applications.

While the invention has been particularly shown and described with reference to the preferred embodiments thereof, it will be understood by those skilled in the art that various changes in form and details may be made without departing from the spirit and scope of the invention.

What is claimed is:

1. A method for fabricating IC'S comprising:

providing a substrate having a layer of dielectric;

providing a first level conductor wiring surrounded by barrier material within the said layer of dielectric;

depositing an metal protect buffer layer over said first level of conductor wiring:

depositing an intermetal dielectric (IMD) layer over said metal protect buffer layor;

patterning and forming damascene openings in said intermetal dielectric (IMD) layer and removing intermetal dielectric to expose the metal protect buffer layer;

removing the patterning material and removing the exposed metal protect buffer layer;

depositing a metal diffusion barrier layer and & copper seed layer over the patterned intermetal dielectric (IMD) layer and over said first level of conductor wiring, into the damascene openings, depositing a copper metal layer by electrochemical deposition (ECD) over said copper seed layer, filling partially the damascene openings;

depositing a copper metal layer by physical vapor deposition (PVD) over the electrochemical deposited copper;

polishing off the excess copper metal layers and the excess metal diffusion barrier layer, thereby planarizing the surface to form interconnect wiring.

2. The method of claim 1, wherein said substrate is semiconductor single crystal silicon or an IC module.

3. The method of claim 1, wherein said method is compatible with MOSFET CMOS processing, devices and circuits, for both logic and memory applications.

4. The method of claim 1, wherein the damascene openings for metal interconnects and via hole contact openings contain a barrier, diffusion barrier liner or diffusion barrier layer, which also aids adhesion, deposited by sputtering (PVD), liner barrier material selected from the group consisting or Ta, TaN and, in a thickness range from about 100 to 4,000 Angstroms.

5. The method of claim 1, wherein the first level of conductor wiring or conducting material consists of the following and is selected from the group consisting of Cu, AlCu alloys, AlCuSi alloys, and W.

6. The method of claim 1, wherein the damascene trench or channel interconnects and via hole contacts can be comprised of a copper seed layer liner, for interconnects and contact vias, deposited by sputtering (PVD), seed type materials comprising of thin Cu, thickness from about 1,000 to 2,000 Angstroms, deposited by ion metal plasma (IMP) or physical vapor deposition (PVD) sputtering.

7. The method of claim 1, wherein the damaecene openings are partially filled with a first copper, inlaid conducting material layer, forming conducting Interconnect lines and contact vias for interconnects and contact vias, and is comprised of copper by electrochemical deposition (ECD), upon a copper seed layer, the ECD Cu approximate thickness from 6,000 to 20,000 Angstroms.

8. The method of claim 1, wherein the damascene openings are filled with a layer of top copper, inlaid conducting material layer, forming conducting interconnect lines and contact vias for interconnects and contact vias, and i comprised of copper by ion metal plasma (IMP) sputter deposition, physical vapor deposition (PVD), or by chemical vapor deposition (CVD), upon an electrochemical deposited (ECD) copper layer, the (IMP) Cu approximate thickness from 1,000 to 5,000 Angstroms, with a deposition rate of approximately 2,000 Angstroms per minute.

9. The method of claim 1, wherein the metal protect buffer layer, is silicon nitride.

10. The method of claim 1, wherein the intermetal dielectric layer (IMD) and in general, dielectric layers, are selected from the group consisting of silicon dioxide or silicon oxide, and/or silicon nitride, deposited by chemical vapor deposition (CVD).

11. The method of claim 1, wherein damascene and dual damascene patterned openings, for subsequent inlaid metal, are formed by the following methods, selected from the group consisting of reactive ion etching (RIE), milling, ion milling, wet etching, or a combination thereof.

12. The method of claim 1, wherein the levels of conducting metal copper layers are planarized by removing excess conducting material to form inlaid dual damascene conducting metal interconnects, in trench and via openings, and this process includes planarization by the following methods, selected from the group consisting of planarization by chemical mechanical polish (CMP), milling, ion milling, and/or etching, or a combination thereof.

13. The method of claim 1, wherein one of the final processing steps is forming by damascene and chemical mechanical polishing (CMP) the inlaid copper metal layers, removing the excess copper metal layers, and the excess conductive metal protect buffer layer and planarizing the surface by chemical mechanical polishing (CMP), forming smooth surface inlaid copper, which remains in the open regions.

14. A method for fabricating smooth copper conducting metal for integrated circuits on a substrate with single or dual damascene structures comprising:

providing a substrate having a layer of dielectric;

providing a first level conductor wiring surrounded by barrier material within the said layer of dielectric;

depositing a metal protect buffer layer over said first level of conductor wiring;

depositing an intermetal dielectric (IMD) layer over said metal protect buffer layer;

patterning and forming damascene openings in said intermetal dielectric (IMD) layer and removing intermetal dielectric to expose the metal protect buffer layer;

removing the patterning material and removing the exposed metal protect buffer layer;

depositing a metal diffusion barrier layer and a copper seed layer over the patterned intermetal dielectric (IMD) layer and over said first level of conductor wiring, into the damascene openings;

depositing a copper metal layer by electrochemical deposition (ECD) over said copper seed layer, filling partially the damascene openings;

depositing a copper metal layer by physical vapor deposition (PVD) over the electrochemical deposited copper;

removing the excess material layers, excess copper and excess barrier layer material, by planarizing the surface by chemical mechanical polish (CMP) to form conducting copper dual inlaid structures which are conducting interconnect lines and contact vias.

15. The method of claim 14, wherein said substrate is semiconductor single crystal silicon or an IC module.

16. The method of claim 14, wherein said method is compatible with MOSFET CMOS processing, devices and circuits, for both logic and memory applications.

17. The method of claim 14, wherein the damascene openings for metal interconnects and via hole contact openings contain a barrier, diffusion barrier liner or diffusion barrier layer, which also aids adhesion, deposited by sputtering (FVD), liner barrier material selected from the group consisting of Ta, TaN and, in a thickness range from about 100 to 4,000 Angstroms.

18. The method of claim 14, wherein the first level of conductor wiring or conducting material consists of the following and is selected from the group consisting of Cu, AlCu alloys, AlCuSi alloys, and W.

19. The method of claim 14, wherein the damascene trench or channel interconnects and via hole contacts can be comprised of a copper seed layer liner, for interconnects and contact vias, deposited by sputtering (PVD), seed type materials comprising of thin Cu, thickness from about 1,000 to 2,000 Angstroms, deposited by ion metal plasma (IMP) or physical vapor deposition (PVD) sputtering.

20. The method of claim 14, wherein the damascene openings are partially filled with a first copper, inlaid conducting material layer, forming conducting interconnect lines and contact vias for interconnect and contact vias, and is comprised of copper by electrochemical deposition (ECD), upon a copper seed layer, the ECD Cu approximate thickness from 6,000 to 20,000 Angstroms.

21. The method of claim 14, wherein the damascene openings are filled with a layer of top copper, inlaid conducting material layer, forming conducting interconnect lines and contact vias for interconnects and contact vias, and in comprised of copper by ion metal plasma (IMP) sputter deposition, physical vapor deposition (PVD), or by chemical vapor deposition (CVD), upon an electrochemical deposited (ECD) copper layer, the (IMP) Cu approximate thickness from 1,000 to 5,000 Angstroms, with a deposition rate of approximately 2,000 Angstrom per minute.

22. The method of claim 14, therein the metal protect buffer layer, is silicon nitride.

23. The method of claim 14, wherein the intermetal dielectric layer (IMD) and in general, dielectric layers, are selected from the group consisting of silicon dioxide or silicon oxide, and/or silicon nitride, deposited by chemical vapor deposition (CVD).

24. The method of claim 14, wherein damascene and dual damascene patterned openings, for subsequent inlaid metal, are formed by the following methods, selected from the group consisting of reactive ion etching (RIE), milling, ion milling, wet etching, or a combination thereof.

25. The method of claim 14, wherein the levels of conducting metal copper layers are planarized by removing excess conducting material to form inlaid dual damascene conducting metal interconnects, in trench and via openings, and this process includes planarization by the following methods, selected from the group consisting of planarization by chemical mechanical polish (CMP), milling, ion milling, and/or etching, or a combination thereof.

26. The method of claim 14, wherein one of the final processing steps is forming by damascene and chemical mechanical polishing (CMP) the inlaid copper metal layers, removing the excess copper metal layers, and the excess conductive metal protect buffer layer and planarizing the surface by chemical mechanical polishing (CMP), forming smooth surface inlaid copper, which remains in the open regions.

27. A method for fabricating MOSFET and CMOS devices on a silicon semiconductor substrate with single or dual damascene structures using electrochemical deposition (ECD) of copper, and ion metal plasma (IMD) deposition of copper, sputtering, or chemical vapor deposition (CVD) of copper, comprising:

providing a silicon semiconductor substrate having a layer of dielectric;

providing a first level conductor wiring surrounded by barrier material within the said layer of dielectric;

depositing a remetal protect buffer layer over said first level of conductor wiring;

depositing an intermetal dielectric (IMD) layer over said metal protect buffer layer;

patterning and forming damascene openings in said intermetal dielectric (IMD) layer and removing intermetal dielectric to expose the metal protect buffer layer;

removing the patterning material and removing the exposed metal protect buffer layer;

depositing a metal diffusion barrier layer and a copper seed layer over the patterned intermetal dielectric (IMD) layer and over said first level of conductor wiring, into the damascene openings;

depositing a copper metal layer by electrochemical deposition (ECD) over said copper seed layer, filling partially the damascene openings;

depositing a top copper metal layer by physical vapor deposition (PVD), ion metal plasma (IMD) deposition, over the electrochemical deposited copper;

removing the excess material layers, excess copper and excess barrier layer material, by planarizing the surface by chemical mechanical polish (CMP) to form conducting copper dual inlaid structures which are conducting interconnect lines and contact vias.

28. The method of claim 27, wherein the damascene openings for metal interconnects and via hole contact openings contain a barrier, diffusion barrier liner or diffusion barrier layer, which also aids adhesion, deposited by sputtering (PVD), liner barrier material selected from the group consisting of Ta, TaN and, in a thickness range from about 100 to 4,000 Angstroms.

29. The method of claim 27, wherein the first level of conductor wiring or conducting material consists of the following and is selected from the group consisting of Cu, AlCu alloys, AlCuSi alloys, and W.

30. The method of claim 27, wherein the damascene trench or channel interconnects and via hole contacts can be comprised of a copper seed layer liner, for interconnects and contact vias, deposited by sputtering (PVD), seed type materials comprising of thin Cu, thickness from about 1,000 to 2,000 Angstroms, deposited by ion metal plasma (IMP) or physical vapor deposition (PVD) sputtering.

31. The method of claim 27, wherein the damascene openings are partially filled with a first copper, inlaid conducting material layer, forming conducting interconnect lines and contact vias for interconnects and contact vias, and is comprised of copper by electrochemical deposition (ECD), upon a copper seed layer, the ECD Cu approximate thickness from 6,000 to 20,000 Angstroms.

32. The method of claim 27, wherein the damascene openings are filled with a layer of top copper, inlaid conducting material layer, forming conducting interconnect lines and contact vias for interconnects and contact vias, and is comprised of copper by ion metal plasma (IMP) sputter deposition, physical vapor deposition (PVD), or by chemical vapor deposition (CVD), upon an electrochemical deposited (ECD) copper layer, the (IMP) Cu approximate thickness from 1,000 to 5,000 Angstroms, with a deposition rate of approximately 2,000 Angstrom per minute.

33. The method of claim 27, wherein the metal protect buffer layer, is silicon nitride.

34. The method of claim 27, wherein the intermetal dielectric layer (IMD) and in general, dielectric layers, are selected from the group consisting of silicon dioxide or silicon oxide, and/or silicon nitride, deposited by chemical vapor deposition (CVD).

35. The method of claim 27, wherein damascene and dual damascene patterned openings, for subsequent inlaid metal, are formed by the following methods, selected from the group consisting of reactive ion etching (RIE), milling, ion milling, wet etching, or a combination thereof.

36. The method of claim 27, wherein the levels of conducting metal copper layers are planarized by removing excess conducting material to form inlaid dual damascene conducting metal interconnects, in trench and via openings, and this process includes planarization by the following methods, selected from the group consisting of planarization by chemical mechanical polish (CMP), milling, ion milling, and/or etching, or a combination thereof.

37. The method of claim 27, wherein one of the final processing steps is forming by damascene and chemical mechanical polishing (CMP) the inlaid copper metal layers, removing the excess copper metal layers, and the excess conductive metal protect buffer layer and planarizing the surface by chemical mechanical polishing (CMP), forming smooth surface inlaid copper, which remains in the open regions.

* * * * *